(12) United States Patent
Do et al.

(10) Patent No.: US 7,984,404 B2
(45) Date of Patent: Jul. 19, 2011

(54) BLACK BOX TIMING MODELING METHOD AND COMPUTER SYSTEM FOR LATCH-BASED SUBSYSTEM

(75) Inventors: Kyung Tae Do, Pohang (KR); Young Hwan Kim, Pohang (KR); Haeng Seon Son, Seongnam (KR)

(73) Assignee: Postech Academy-Industry Foundation, Pohang, Kyungsangbuk-do (KR)

( * ) Notice: Subject to any disclaimer, the term of this patent is extended or adjusted under 35 U.S.C. 154(b) by 864 days.

(21) Appl. No.: 11/934,252

(22) Filed: Nov. 2, 2007

(65) Prior Publication Data

US 2008/0141201 A1   Jun. 12, 2008

(30) Foreign Application Priority Data

Nov. 15, 2006   (KR) .................. 10-2006-0113034

(51) Int. Cl.
  *G06F 9/455*   (2006.01)
  *G06F 17/50*   (2006.01)
(52) U.S. Cl. ...................................... 716/108
(58) Field of Classification Search ............... 716/6, 108
  See application file for complete search history.

(56) References Cited

U.S. PATENT DOCUMENTS

| 6,611,948 B1 * | 8/2003 | Tyler et al. ............. 716/6 |
| 2007/0226668 A1 * | 9/2007 | Dasdan et al. ............. 716/6 |

OTHER PUBLICATIONS

Daga et al.; "Automated Timing Model Generation"; Jun. 14, 2002; Synopsys, Inc.; pp. 146-152.*

* cited by examiner

*Primary Examiner* — Suresh Memula
(74) *Attorney, Agent, or Firm* — Rothwell, Figg, Ernst & Manbeck, pc

(57) ABSTRACT

Provided is a black box timing modeling method for a digital circuit comprising synchronous elements including latches. The method includes: characterizing a setup time arc by extracting a setup time with respect to a rising or falling edge of a clock of a synchronous element with respect to an input connected to the synchronous element and forming the setup time arc using the extracted setup time; and characterizing a clock-to-output delay arc by providing information on an output departure time from an output based on a rising or falling edge of a clock of a closest synchronous element connected to the output, at least partially based on the setup time arc and forming the clock-to-output delay arc. Accordingly, the method can be efficiently used for a latch-based design without re-verifying internal components of the latch-based design during an upper-level verification, thereby reducing verification time and model size.

19 Claims, 8 Drawing Sheets

FIG. 8

```
Procedure LAT ( )
  /* Initialization */
  foreach clock φ do
    foreach latch L controlled by φ do
      signal arrival time of latch L = falling edge of φ-setup time of L;
      pushing_latch of L = L;
  /* Main process */
  while (1)
    foreach clock φ do
      foreach latch L controlled by φ do
        L_fo.max = fanout latch of L, requiring the largest move of input signal arrival time of L, to
                   avoid its setup time violation;
        /* Updating the arrival time of visited latch */
        max_required_move = move size of input signal arrival time of L by L_fo.max in backward
                             direction in time;
        if ( max_required_move is not 0 ) then
          /* Critical loop detection for setup violation detection */
          if ( pushing_latch of L_fo.max = L ) then
            setup_violation = TRUE;
            exit;
          /* Setup violation detection */
          arrival time of L = arrival time of L - max_required_move ;  /* move backward */
          if ( arrival time of L is in ERROR zone ) then
            setup_violation = TRUE;
            exit;
          pushing_latch of L = pushing_latch of L_fo.max;
    if ( there has been no modification for all clocks ) then
      return arrival time of each latch, LAT ;
      break;
```

FIG. 9

```
Procedure LDT ( )
/* Initialization */
foreach primary input PI do
  /* input latch: latch adjacent to primary input */
  foreach input latch IL do
    /* φ_IL: clock controlling IL */
    departure time of IL w.r.t. PI = Max { (LAT of PI + delay from PI to IL), rising edge of φ_IL) };
  foreach latch L ∉ IL do
    departure time of IL w.r.t. PI = null;
/* Main Process */
while(1)
  foreach clock φ do
    foreach latch L controlled by φ do
      foreach primary input PI do
        if (there is at least one fanin latch FL such that departure time of FL w.r.t. PI is not null) then
          if (departure time of L w.r.t. PI = NULL) then
            departure time of L w.r.t. PI =
              Max_j{ (departure time of FL w.r.t. PI + delay from FL to L)_j, rising edge of φ) };
            /* j = fanin latch number */
          else
            departure time of L w.r.t. PI =
              Max_j{ departure time of L w.r.t. PI, (departure time of FL w.r.t. PI + delay from FL
                to L)_j, rising edge of φ) };
          /* finding critical delay */
  if (there has been no modification of departure time for all latches) then
    foreach primary input PI do
      foreach primary input PO do
        LDT of PI-PO pair = departure time of PO w.r.t. PI;
    break;
```

FIG. 10

```
Procedure EDT ( )
/* Initialization */
foreach primary input PI do
    /* input latch: latch adjacent to primary input */
    foreach input latch IL do
        /* φ_IL: clock controlling IL */
        departure time of IL w.r.t. PI = Max { delay from PI to IL, rising edge of φ_IL) };
    foreach latch L ∉ IL do
        departure time of IL w.r.t PI = null;
/* Main Process */
while(1)
    foreach clock φ do
        foreach latch L controlled by φ do
            foreach primary input PI do
                if (there is at least one fanin latch FL such that departure time of FL w.r.t. PI is not null) then
                    if (departure time of L w.r.t. PI = NULL) then
                        departure time of L w.r.t. PI =
                            Max_j{ (departure time of FL w.r.t. PI + delay from FL to L)_j, rising edge of φ) };
                        /* j = fanin latch number */
                    else
                        departure time of L w.r.t. PI =
                            Max_j{ departure time of L w.r.t. PI, (departure time of FL w.r.t. PI + delay from FL
                            to L)_j, rising edge of φ) };
                    /* finding critical delay */
    if (there has been no modification of departure time for all latches) then
        foreach primary input PI do
            foreach primary input PO do
                EDT of PI-PO pair = departure time of PO w.r.t. PI;
        break;
```

BLACK BOX TIMING MODELING METHOD AND COMPUTER SYSTEM FOR LATCH-BASED SUBSYSTEM

CROSS-REFERENCE TO RELATED PATENT APPLICATION

This application claims the benefit of Korean Patent Application No. 10-2006-0113034, filed on Nov. 15, 2006, in the Korean Intellectual Property Office, the disclosure of which is incorporated herein in its entirety by reference.

BACKGROUND OF THE INVENTION

1. Field of the Invention

The present invention relates to semiconductor design, timing verification, and modeling, and Intellectual Property (IP) modeling using computer-aided design (CAD), and more particularly, to a black box timing method and a computer system for a very large scale integrated circuit (VLSI) design.

2. Description of the Related Art

Timing models for latch-based designs include gray box models, which are the best-known models, and models using transparent latch path collapsing techniques.

Such conventional timing models have problems in that internal components of the latch-based designs represented by the timing models should be re-verified during upper-level verification together with other designs. Accordingly, the conventional timing models are not suitable as timing models for Intellectual Property (IP). In particular, since the best-known gray box models retain delay information between all internal synchronous elements, the gray box models are large in size, thereby resulting in more complicated verification.

FIG. 1 illustrates a conventional black box timing model. Referring to FIG. 1, the conventional black box timing model includes a combination delay arc between an input and an output, a clock-to-output delay arc and a setup/hold arc extracted from synchronous elements and pins at the boundary of a macro block, and timing information on a pin at the boundary of a block which is a setup/hold time.

In order to obtain timing information on a circuit, a black box timing model made by Synopsis Inc. extracts a setup/hold arc only from a synchronous element adjacent to an input and extracts a clock-to-output delay arc from a synchronous element adjacent to an output. As for a flip-flop system, when single stage timing constraints of all flip flop pairs which are adjacent each other are met, the timing verification of the overall flip-flop system is completed. Accordingly, once synchronous elements adjacent to an input and an output in the flip-flop system satisfy timing conditions, other internal flip-flops automatically satisfy timing conditions.

However, a latch-synchronized system has a timing borrowing property. Accordingly, although latches adjacent to an input and an output satisfy timing conditions and thus there is no timing error, a timing error may occur in internal latches if a latch adjacent to an input borrows time from a fan-out latch and continuous time borrowing occurs. Also, the latch-synchronized system can be configured such that an output departure time is in linear proportion to an input arrival time, thereby making it difficult to model timing features.

Therefore, there is a pressing need for timing models that can be efficiently used for latch-based designs without re-verifying internal components of latch-based designs during upper-level verification. Also, there is a pressing need for a method of accurately modeling the characteristics of a latch-synchronized system having a timing borrowing property due to its transparency.

SUMMARY OF THE INVENTION

The present invention provides a timing model that can be used for Intellectual Property (IP) or a sub-block design including a latch, and particularly, a timing modeling method that can be efficiently used for a latch-based design, whose timing features have not been effectively modeled so far, through only interface verification without re-verifying internal components of the latch-based design during upper-level verification.

The present invention also provides a method of accurately modeling the characteristics of a latch-synchronized system having a timing borrowing property due to its transparency.

The present invention also provides a computer system that can simultaneously perform model characterization and timing verification to previously check a timing error in a latch-based design that is to be modeled.

According to an aspect of the present invention, there is provided a black box timing modeling method for a digital circuit comprised of synchronous elements including latches, the method comprising: characterizing a setup time arc by extracting a setup time with respect to a rising or falling edge of a clock of a synchronous element with respect to an input connected to the synchronous element and forming the setup time arc using the extracted setup time; and characterizing a clock-to-output delay arc by providing information on an output departure time from an output based on a rising or falling edge of a clock of a closest synchronous element connected to the output, at least partially based on the setup time arc and forming the clock-to-output delay arc.

The method may further comprise characterizing a combinational delay arc by searching for input-output pairs each having no synchronous element therebetween and forming a combinational delay arc having a critical path delay between an input and an output from the input-output pairs.

The method may further comprise characterizing a hold time arc by obtaining a minimum value by subtracting a lowest delay among synchronous elements adjacent to an input from a hold time of pertinent synchronous elements, determining the minimum value as a hold time of the input, and forming a hold time arc using the hold time.

The characterizing of the setup time arc may be performed using a latest arrival time (LAT) computer program that simultaneously performs setup time arc characterization and setup time violation checking.

The characterizing of the clock-to-output delay arc may comprise obtaining an earliest output departure time (EDT) and a latest output departure time (LDT) using LDT/EDT algorithm. The EDT and the LDT are obtained by controlling an input arrival time adequately, respectively. The output departure time is directly proportional to the input arrival time in case that timing borrowing occurred on an overall path.

In order to obtain the LDT, departure times of all synchronous elements adjacent to an input may be set to the LAT obtained by the characterizing of the setup time arc, and a signal may be transmitted and a latest signal arrival time at an output may be obtained. In order to obtain the EDT, input departure times of synchronous elements adjacent to an input may be set to a point of time when the synchronous elements start to transmit a signal, and a signal may be transmitted and a earliest signal arrival time at an output may be obtained.

According to another aspect of the present invention, there is provided a black box timing modeling computer system for a digital circuit comprised of synchronous elements including latches, the computer system comprising a bus, a processor, and a memory, wherein the processor comprises: a combinational delay arc characterization module providing delay information between an input and an output having no synchronous element therebetween; a hold time arc characterization module extracting a hold time with respect to a rising or falling edge of a clock of a synchronous element adjacent the input connected to a synchronous element and forming a hold time arc; a setup time arc characterization module extracting a setup time with respect to the rising or falling edge of the clock of the synchronous element with respect to the input connected to the synchronous element and forming a setup time arc using the extracted setup time; and a clock-to-output delay arc characterization module providing information on a departure time from an output based on a rising or falling edge of a clock of a closest synchronous element connected to an output, at least partially based on the setup time arc.

The characterizing of the setup time arc may comprise: obtaining an LAT that does not cause a timing error in all internal synchronous elements; obtaining a minimum value by subtracting a delay to a pertinent synchronous element from LATs of synchronous elements adjacent to an input to obtain an LAT of each input; and obtaining a setup time as a difference between the obtained LAT and an edge of a reference clock associated with the input.

The characterizing of the setup time arc may comprise checking whether a signal arrival time of an internal synchronous element is within an acceptable time period when the signal arrival time is updated, in order to perform setup time violation checking.

The characterizing of the setup time arc may comprise checking whether the delay of a loop, which is comprised of synchronous elements in a circuit, exceeds a delay acceptable range, in order to perform setup time violation checking.

BRIEF DESCRIPTION OF THE DRAWINGS

The above and other features and advantages of the present invention will become more apparent by describing in detail exemplary embodiments thereof with reference to the attached drawings in which:

FIG. 8 illustrates a latest arrival time (LAT) algorithm used in the setup time arc characterizing operation of FIG. 2 when a latch in a system is an active high type;

FIG. 9 illustrates a latest output departure time (LDT) algorithm used in the clock-to-output delay arc characterizing operation of FIG. 2 when an LDT with a longest delay is extracted; and FIG. 10 illustrates an earliest output departure time (EDT) algorithm used in the clock-to-output delay arc characterizing operation of FIG. 2 when an EDT with a longest delay is extracted.

DETAILED DESCRIPTION OF THE INVENTION

The present invention will now be described more fully with reference to the accompanying drawings, in which exemplary embodiments of the invention are shown.

Figure 1:
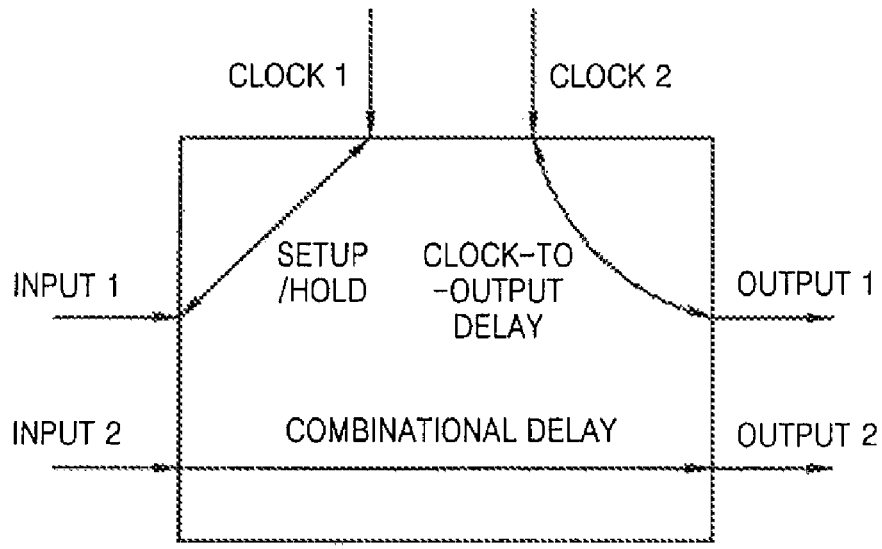
FIG. 1 illustrates a conventional black box timing model.
Figure 2:
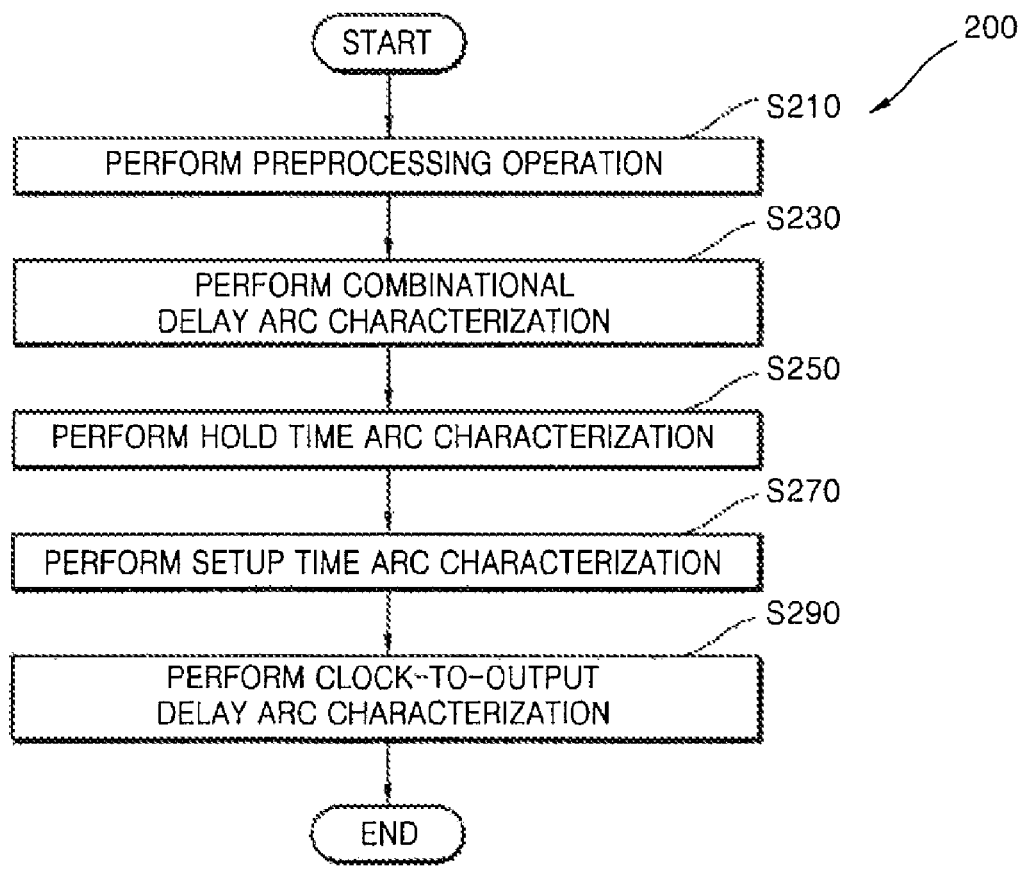
FIG. 2 is a flowchart of a black box timing modeling method according to an embodiment of the present invention.

FIG. 2 is a flowchart of a black box timing modeling method 200 according to an embodiment of the present invention. Referring to FIG. 2, in preprocessing operation S210, a static timing analysis process is performed on a circuit, synchronous elements and primary input-outputs are converted into nodes based on the analysis result, when an electrical signal can be transmitted between the adjacent synchronous elements or the input-outputs, link relationships between the synchronous elements or the input-outputs are converted into directed edges according to the directions of signal transmission, and the weights of the edges are defined as delays for the signal transmission to obtain a weighted graph. The preprocessing operation S210 may be performed using the multiple critical path analysis (MCPA) algorithm disclosed by S. Y. Han and Y. H. Kim in "Efficient Timing Verification of Latch-Synchronized Systems," IEICE Transactions on Fundamentals of Electronics, Communications and Computer Sciences E80-A (9), 1997, pp. 1676-1683.

In combinational delay arc characterizing operation S230, input-output pairs each having no synchronous element therebetween are searched in the graph obtained by the preprocessing operation S210 and a combinational delay arc having a critical path delay between an input and an output is formed for the input-output pairs.

In hold time arc characterizing operation S250, a minimum value is calculated by subtracting a lowest delay among synchronous elements adjacent to an input from a hold time of a pertinent synchronous element and is determined to be a hold time of the input, and a hold time arc is formed using the hold time.

In setup time arc characterizing operation S270, a setup time of each input is extracted using a proposed latest arrival time (LAT) algorithm (see FIG. 8), and a setup time arc is formed using the extracted setup time. The LAT algorithm simultaneously performs characterization and setup time violation checking. The proposed LAT algorithm obtains an LAT that does not cause a timing error in all internal synchronous elements of the circuit. Next, a minimum value is calculated by subtracting a delay to a pertinent synchronous element from LATs of synchronous elements adjacent to an input to obtain an LAT of each input. A difference between the obtained LAT and an edge, which corresponds to the end of an active period of a latch, of a reference clock associated with the input is obtained as a setup time, and a setup time arc is formed using the obtained setup time.

Figure 4:
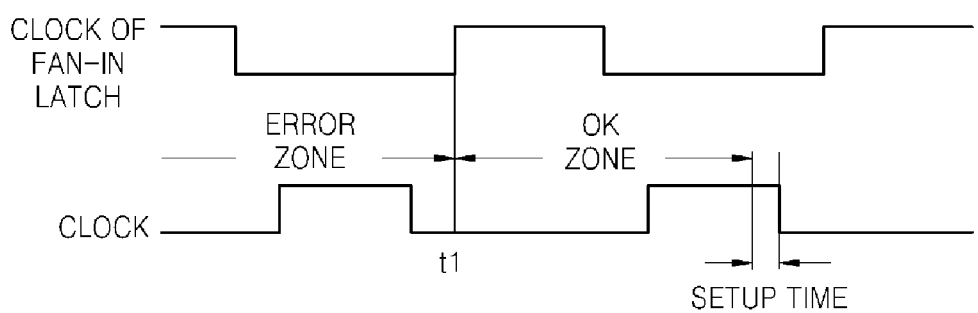
FIG. 4 is a view for explaining the concept of an error zone.

The LAT algorithm performs the setup time violation checking on the internal components in two ways. The first way is to check whether a signal arrival time of an internal synchronous element is within an acceptable time period when the signal arrival time is updated. Referring to FIG. 4, when a path is not a multi-cycle path or a zero-cycle path, the acceptable time period is an OK zone spanning from the end of an active period or an activating edge of a fan-in synchronous element to a setup time prior to an edge of a current clock.

When the signal arrival time is outside the acceptable time period in the process of obtaining the LAT, it is determined that timing error exists. A zone outside the OK zone is an error zone in FIG. 4.

The second way is to check whether the delay of a loop, which is comprised of synchronous elements in the circuit, exceeds an acceptable range. The second way using the loop can detect a timing error faster than the first way. The second way is performed by transmitting information on a latch whose input arrival time needs to be changed due to a timing error, and when the transmitted information on the latch is identical with information on a current latch, determining that the pertinent latch belongs to the loop and the delay of the loop exceeds the acceptable range. Accordingly, if the LAT algorithm is performed further, the input arrival time is placed in the error zone of the first timing verification way, thereby causing a timing error. Accordingly, the timing error should be found in advance.

In clock-to-output delay arc characterizing operation S290, the input-output characteristic curve of all weakly connected input-output pairs in the graph is obtained using the proposed latest output departure time (LDT) and the earliest output departure time (EDT) algorithms. Since an output departure time is determined by an input signal arrival time in a latch-synchronized system, all effects of an input on an output should be considered to obtain the output departure time. Output departure time characteristics with respect to an input may be determined as follows.

Figure 3:
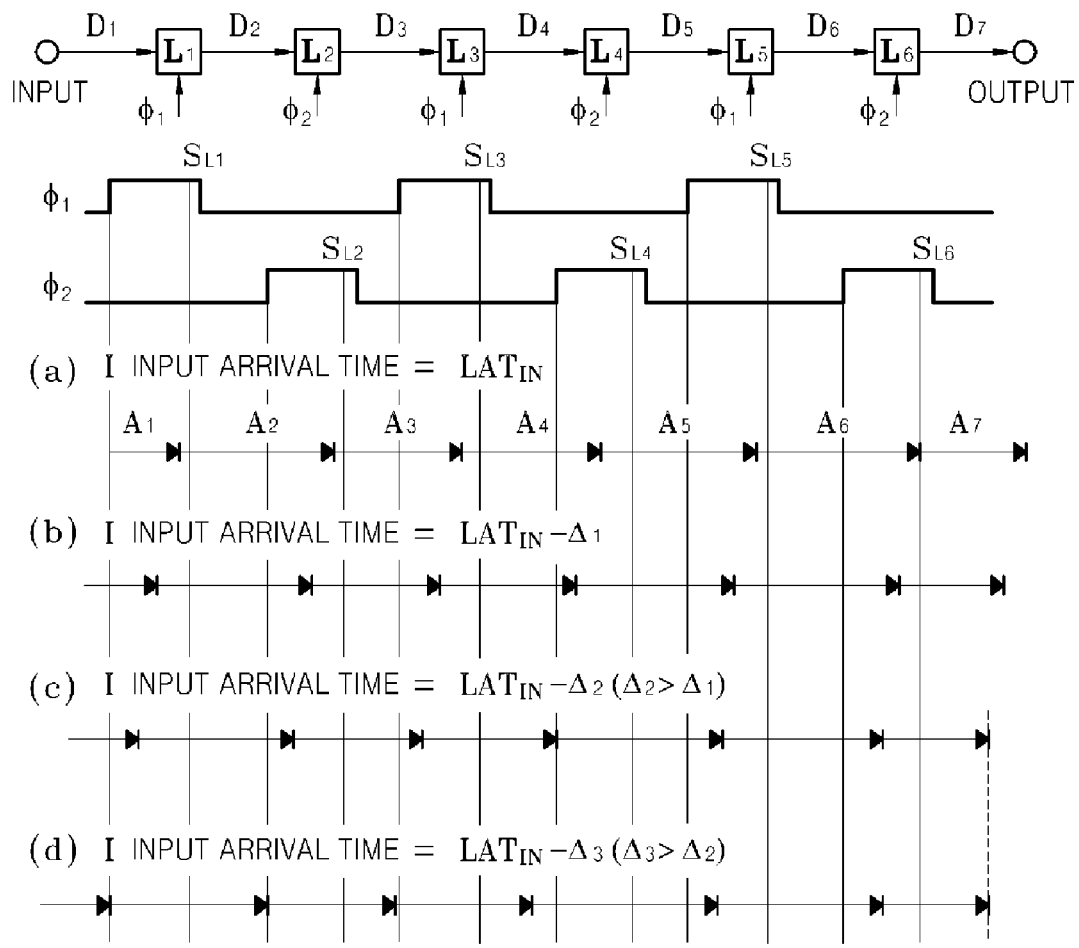
FIG. 3 is a timing diagram of a latch-based system for showing clock-to-output delay characteristics of FIG. 2.

FIG. 3 is a timing diagram of the latch-based system for showing clock-to-output delay characteristics. In FIG. 3, $L_1$ through $L_7$ denote latches, $D_i$ denotes a critical path delay between $L_i$ and $L_{i+1}$, $S_{L1}$ through $S_{L6}$ denote setup times at stages, and $\phi_1$ and $\phi_2$ denote clocks supplied to the latches $L_1$ through $L_7$.

Figure 5:
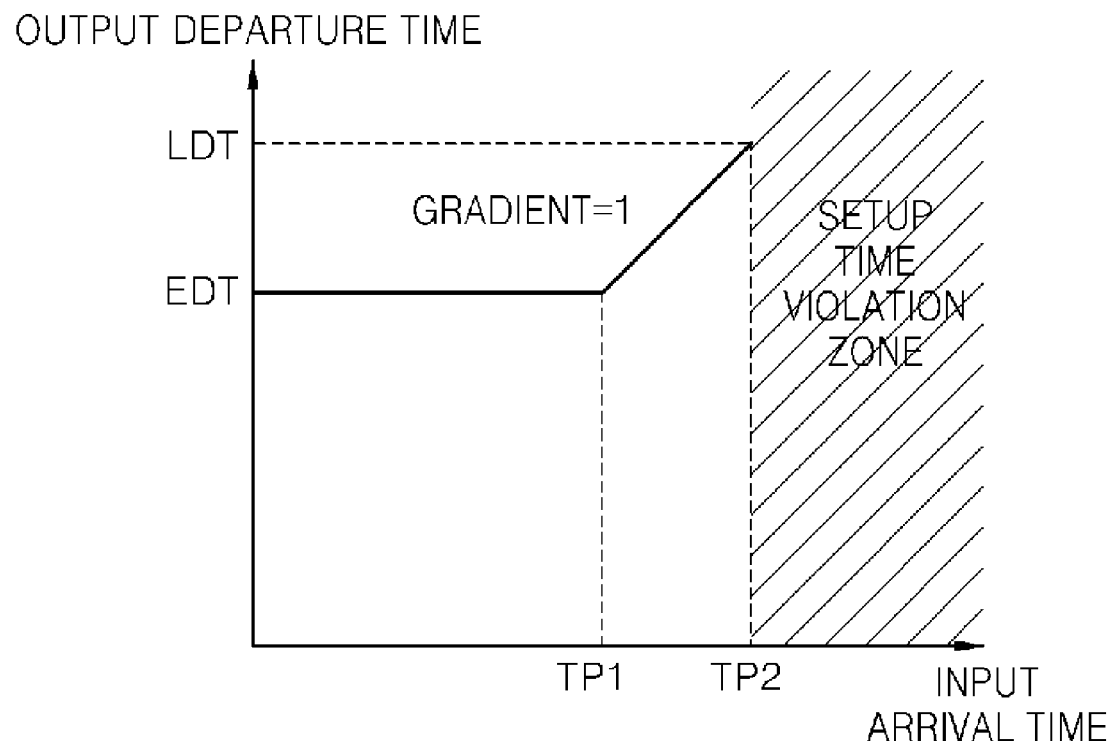
FIG. 5 is a graph illustrating a relationship between an output departure time and an input arrival time of the latch-based system for showing clock-to-output delay characteristics of FIG. 2.

In FIG. 3, it is assumed that, a signal arrives at an input at an $LAT_{IN}$ (note that LAT means latest arrival time that does not cause timing violation of internal synchronous elements), and it is also assumed that all latches are borrowing latches. Next, an output signal departs from an output at an LDT as shown by an arrow in FIG. 3 (a). Referring to FIG. 3 (b), it is assumed that a time when a signal arrives at an input is faster than the $LAT_{IN}$ by $\Delta_1$. Next, an output signal departs from an output earlier by $\Delta_1$. Accordingly, it can be seen that an output departure time is linearly dependent on an input arrival time. Referring to FIG. 3 (c), the linear dependence is continued until one internal latch becomes a non-borrowing latch. In FIG. 3, the latch $L_4$ becomes a non-borrowing latch. Referring to FIG. 3 (d), if an input signal arrives at an input earlier, the latch $L_4$ remains a non-borrowing latch and an output departure time is maintained. FIG. 5 is a graph illustrating output departure time characteristics obtained from the clock-to-output delay characteristics of the latch-synchronized system. This is explained in more detail by K. T. Do, Y. H. Kim, H. S. Son, "Timing Modeling of Latch-Controlled Sub-Systems," *Integration, The VLSI Journal*, Vol. 40, No. 2, pp. 62-73, February 2007.

The LDT and the EDT necessary to determine the characteristic curve of FIG. 5 should be obtained. LDT and EDT algorithms for obtaining the LDT and the EDT are illustrated in FIGS. 9 and 10.

In the initialization of the LDT algorithm, latches adjacent to all primary inputs (PIs) are searched and signal departure times of the latches adjacent to a PI are set to the latest departure time which does not cause timing error. The latest departure time is obtained by adding a delay between the PI and the latch to the LAT that is obtained by the LAT algorithm. However, if the signal departure time is prior to a rising edge of a clock at which the latch is activated, a signal is to depart from the rising edge at which the latch is activated. Accordingly, Departure time of the latch is initialized to the rising edge of the clock. Next, as for latches not adjacent to the input, signal departure times associated with all inputs are set to null. As for latches adjacent to inputs, signal departure times associated with PIs to which the latches are not adjacent are set to null.

In the main process of the LDT algorithm, a latch that uses each of clocks used by a design is visited and a signal departure time of a signal departing from each PI is adjusted. A fan-in latch of the visited latch is searched, and when there is a signal departure time with respect to a current selected PI, the signal departure time of the current visited latch with respect to the selected PI is updated with a value that is obtained by adding a delay between the fan-in latch and the current visited latch to the signal departure time of the fan-in latch with respect to the selected PI. Even in this case, since in the case where the departure time is prior to a rising edge of a clock, an actual signal departs from the rising edge, the departure time is updated with the rising edge, similarly to the initialization. If the signal departure time with respect to the selected PI of the current visited latch is not null, the departure time is updated with the higher value of the two values. When this update is no longer necessary, a latest signal departure time of a signal departing from each PI is obtained from a primary output (PO). Since signal departure times with respect to all the PIs have been calculated in this process, the latest signal departure time of the PO with respect to the PI is obtained and is used as an LDT in the output departure time characteristics of FIG. 5.

An EDT is opposite to the LDT. While the latest signal output time from each PI is used to obtain the LDT during the initialization, an earliest departure time is used to obtain the EDT. Accordingly, a signal departure time of a latch connected to a PI is initialized to a rising edge of a clock which corresponds to an earliest departure time. As described above, as for latches not adjacent to inputs, signal departure times with respect to all PIs are set to null. As for latches adjacent to inputs, signal departure times with respect to PIs to which the latches are not adjacent are set to null. Next, in the main process of the EDT algorithm, a signal departure time is obtained in the same manner as in the LDT algorithm. That is, the initialization is different between the LDT and EDT algorithms but the main process is the same between the LDT and EDT algorithms. While an update process is continued, a signal departure time from an output with respect to a PI is obtained and is used as an EDT.

After the LDT and the EDT are obtained using the LDT and the EDT algorithms, the output departure time characteristics of all associated input-output pairs are obtained as shown in FIG. 5 since TP2 is an LAT of a pertinent input and a TP1 is obtained by subtracting a difference between the LDT and the EDT from the TP2. The proposed LDT and EDT algorithms can be used to obtain output characteristics based on a longest path delay, and output characteristics based on a shortest path delay can be obtained by converting Max operations in the LDT and the EDT algorithms into Min operations and using a shortest path delay. Accordingly, a clock-to-output delay arc can be obtained by extracting each of the LDT and the EDT based on the shortest path delay and the longest path delay with respect to all the associated input-output pairs.

The timing model can accurately extract the timing features of the latch-synchronized system through the above operations and can be efficiently used for the timing verification of the latch-synchronized system through only interface verification without re-verifying the internal components of the latch-synchronized system.

Figure 6:
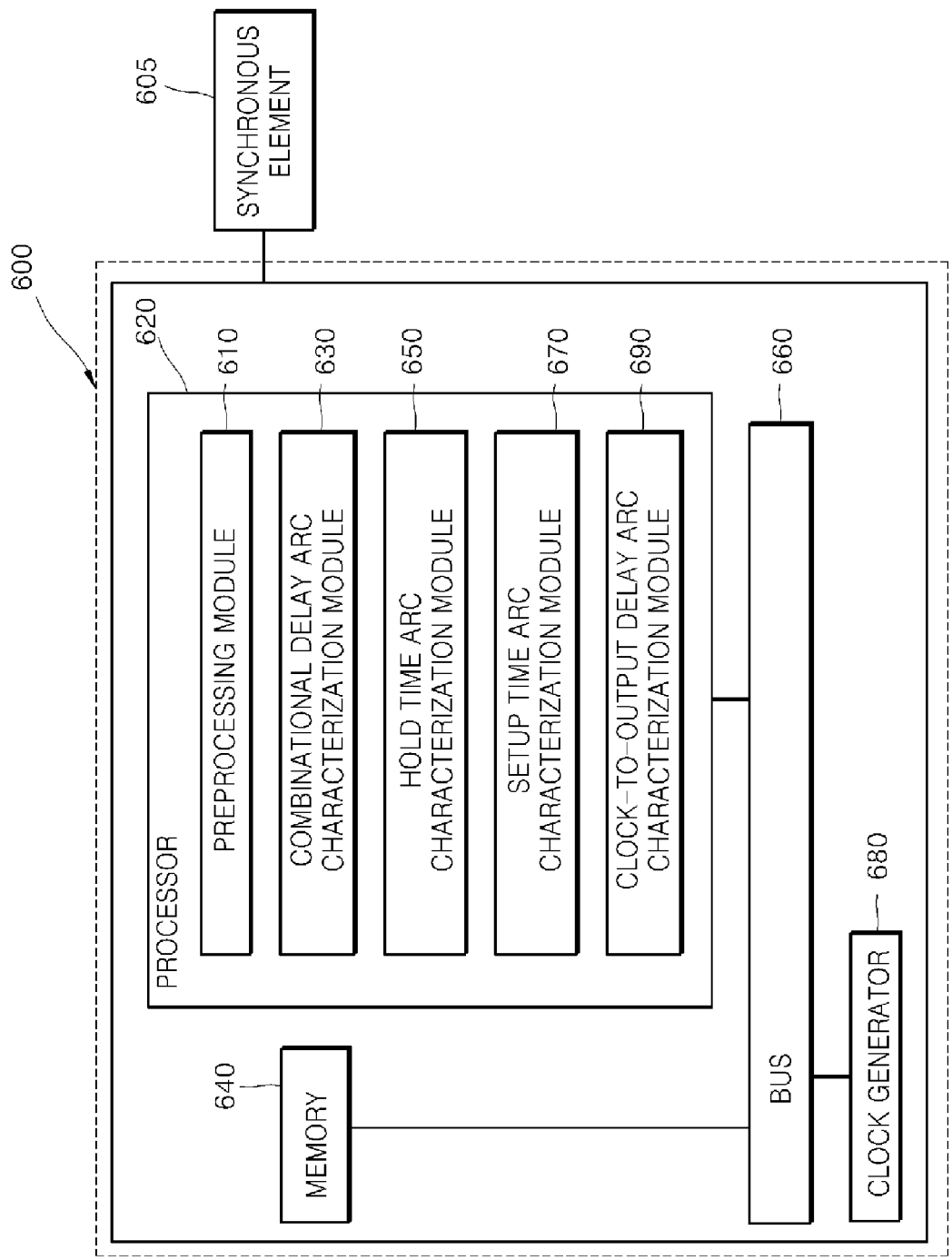
FIG. 6 is a block diagram of a computer system including a black box timing modeling module according to an embodiment of the present invention.
Figure 7:
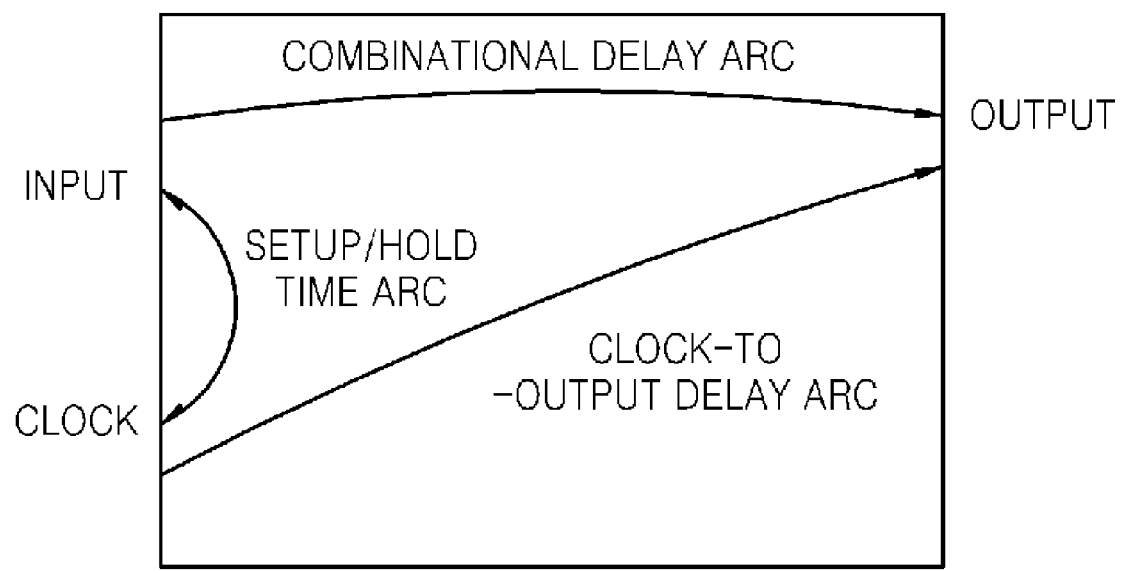
FIG. 7 illustrates a black box timing model according an embodiment of the present invention.

FIG. 6 shows a computer system 600 including a black box timing modeling module according to an embodiment of the present invention. The computer system 600 includes a processor 620 that performs the above-described black box timing modeling method. The black box timing modeling computer system 600 for a digital circuit comprised of synchronous elements 605 including latches includes the processor 620, a memory 640, a bus 660, and a clock generator 680. The processor 620 includes a preprocessing module 610, a combinational delay arc characterization module 630 providing delay information between an input and an output with no synchronous element therebetween, a hold time arc characterization module 650 extracting a hold time with respect to a rising or falling edge of a clock of a first synchronous element with respect to an input connected to the synchronous element and forming a hold time arc using the extracted hold time, a setup time arc characterization module 670 extracting a setup time with respect to the rising or falling edge of the first synchronous element with respect to the input connected to the synchronous element and forming a setup time arc using the extracted setup time, and a clock-to-output delay arc characterization module 690 providing information on a departure time from an output based on a rising or falling edge of a clock of a closest synchronous element connected to the output.

The combinational delay arc characterization module 630 characterizes a combinational delay arc. The hold time arc characterization module 650 characterizes the hold time arc. The setup time arc characterization module 670 characterizes the setup time arc. The clock-to-output delay arc characterization module 690 characterizes a clock-to-output delay arc.

Since the present invention can be efficiently used as a timing model for a latch-based design during upper-level verification without re-verifying internal components of the latch-based design, thereby reducing a verification time.

Furthermore, the present invention can accurately model the characteristics of a latch-synchronized system having a timing borrowing property because of its transparency.

Moreover, the present invention can simultaneously perform model characterization and timing verification.

In addition, since the present invention requires only interface information, the size of the timing model can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A black box timing modeling method for a digital circuit comprising synchronous elements including latches, the method comprising:
    characterizing a setup time arc by extracting a setup time with respect to a rising or falling edge of a clock of a synchronous element with respect to an input connected to the synchronous element and forming the setup time arc using the extracted setup time, in a processor of a computer system; and
    characterizing a clock-to-output delay arc by providing information on an output departure time from an output based on a rising or falling edge of a clock of a closest synchronous element connected to the output, at least partially based on the setup time arc and forming the clock-to-output delay arc, in the processor; and
    performing a preprocessing operation in the processor,
    wherein the preprocessing operation comprises:
    performing static timing analysis on the circuit; and
    obtaining a weighted graph by converting synchronous elements and main input-outputs into nodes, when an electrical signal can be transmitted between the synchronous elements or the input-outputs, converting link relationships between the synchronous elements or the input-outputs into directed edges according to the directions of signal transmission, and determining weights of the directed edges as delays for the signal transmission.

2. The method of claim 1, further comprising characterizing a combinational delay arc by searching for input-output pairs each having no synchronous element therebetween and forming a combinational delay arc having a critical path delay between an input and an output from the input-output pairs.

3. The method of claim 1, further comprising characterizing a hold time arc by obtaining a minimum value by subtracting a lowest delay among synchronous elements adjacent to an input from a hold time of a pertinent synchronous element, determining the minimum value as a hold time of the input, and forming a hold time arc using the hold time.

4. The method of claim 1, wherein the characterizing of the setup time arc is performed using a latest arrival time (LAT) computer program that simultaneously performs setup time arc characterization and setup time violation checking.

5. The method of claim 1, wherein the characterizing of the setup time arc comprises:
    obtaining an LAT that does not cause a timing error in all internal synchronous elements;
    obtaining a minimum value by subtracting a delay to a pertinent synchronous element from LATs of synchronous elements adjacent to an input to obtain an LAT of each input; and
    obtaining as a setup time a difference between the obtained LAT and an edge of a reference clock associated with the input.

6. The method of claim 1, wherein the characterizing of the setup time arc comprises checking whether a signal arrival time of an internal synchronous element is within an acceptable time period when the signal arrival time is updated, in order to perform setup time violation checking.

7. The method of claim 6, wherein, when a path is not a multi-cycle path or a zero-cycle path, the acceptable time period spans from the end of an active period or an activating edge of a fan-in synchronous element to a setup time prior to an edge of a current clock.

8. The method of claim 1, wherein the characterizing of the setup time arc comprises checking whether the delay of a loop, which comprises synchronous elements in a circuit, exceeds a delay acceptable range, in order to perform setup time violation checking.

9. The method of claim 8, wherein the setup time violation checking is performed by transmitting information on a latch whose input arrival time needs to be changed due to timing error, and, when the transmitted information on the latch is identical with information on a current latch, determining that the pertinent latch belongs to the loop and the delay of the loop exceeds the acceptable range.

10. The method of claim 1, wherein the characterizing of the clock-to-output delay arc comprises providing information on departure times with respect to all inputs associated with an output.

11. The method of claim 1, wherein the characterizing of the clock-to-output delay arc, comprises obtaining the output departure time of a latch-synchronized system from the system characteristics that an output departure time with respect to an input arrival time is held at the level of an earliest output departure time (EDT) until a first point of time and is then increased to the level of a latest output departure time (LDT) at a predetermined gradient until a second point of time as the boundary of a setup time violation zone.

12. The method of claim 11, wherein the gradient is substantially 1.

13. The method of claim 11, wherein, in order to obtain the LDT, departure times of all synchronous elements adjacent to an input are set to the LAT obtained by the characterizing of the setup time arc, and a signal is transmitted and a latest signal arrival time at an output is obtained.

14. The method of claim 11, wherein, in order to obtain the EDT, input departure times of synchronous elements adjacent to an input are set to a point of time when the synchronous elements start to transmit a signal, and a signal is transmitted and a earliest signal arrival time at an output is obtained.

15. The method of claim 11, wherein the second point of time is an LAT of a pertinent input, and the first point of time is obtained by subtracting a difference between the LDT and the EDT from the second point of time.

16. A computer system comprising a processor controlling the timing of a digital circuit comprising synchronous elements including latches,
wherein the processor performs:
characterizing a setup time arc by extracting a setup time with respect to a rising or falling edge of a clock of a synchronous element with respect to an input connected to the synchronous element and forming the setup time arc using the extracted setup time; and
characterizing a clock-to-output delay arc by providing information on an output departure time from an output based on a rising or falling edge of a clock of a closest synchronous element connected to the output, at least partially based on the setup time arc; and
a preprocessing operation,
wherein the preprocessing operation comprises:
performing static timing analysis on the circuit; and
obtaining a weighted graph by converting synchronous elements and main input-outputs into nodes, when an electrical signal can be transmitted between the synchronous elements or the input-outputs, converting link relationships between the synchronous elements or the input-outputs into directed edges according to the directions of signal transmission, and determining weights of the directed edges as delays for the signal transmission.

17. A computer system comprising a processor controlling the timing of a digital circuit comprising synchronous elements including latches,
wherein the processor comprises:
a setup time arc characterization module extracting a setup time with respect to a rising or falling edge of a clock of a synchronous element with respect to an input connected to the synchronous element and forming a setup time arc using the extracted setup time; and
a clock-to-output delay arc characterization module providing information on a departure time from an output based on a rising or falling edge of a clock of a closest synchronous element connected to an output, at least partially based on the setup time arc,
wherein the setup time arc characterization module is further configured to check whether the delay of a loop, which comprises synchronous elements in a circuit, exceeds a delay acceptable range, in order to perform setup time violation checking; and
wherein the setup time violation checking is performed by transmitting information on a latch whose input arrival time needs to be changed due to timing error, and, when the transmitted information on the latch is identical with information on a current latch, determining that the pertinent latch belongs to the loop and the delay of the loop exceeds the acceptable range.

18. The computer system of claim 17, further comprising a combinational delay arc characterization module characterizing a combinational delay arc by searching for input-output pairs each having no synchronous element therebetween and forming a combinational delay arc having a critical path delay between an input and an output from the input-output pairs.

19. The computer system of claim 17, further comprising a hold time arc characterization module characterizing a hold time arc by obtaining a minimum value by subtracting a lowest delay among synchronous elements adjacent to an input from a hold time of a pertinent synchronous element, determining the minimum value as a hold time of the input, and forming a hold time arc using the hold time.

* * * * *